(12) United States Patent
Chou et al.

(10) Patent No.: US 11,039,680 B2
(45) Date of Patent: Jun. 22, 2021

(54) PULL-OUT CARRYING HANDLE

(71) Applicant: GETAC TECHNOLOGY CORPORATION, Hsinchu County (TW)

(72) Inventors: Hsin-Chih Chou, Taipei (TW); Juei-Chi Chang, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/262,803

(22) Filed: Jan. 30, 2019

(65) Prior Publication Data

US 2019/0350352 A1  Nov. 21, 2019

Related U.S. Application Data

(60) Provisional application No. 62/672,514, filed on May 16, 2018.

(51) Int. Cl.
| | | |
|---|---|---|
| A45C 13/22 | (2006.01) | |
| H05K 5/02 | (2006.01) | |
| A45F 5/10 | (2006.01) | |
| A45C 13/26 | (2006.01) | |

(52) U.S. Cl.
CPC ............. *A45F 5/102* (2013.01); *A45C 13/22* (2013.01); *A45C 13/26* (2013.01); *H05K 5/023* (2013.01)

(58) Field of Classification Search
CPC ......... A45C 13/22; A45C 13/30; A45C 13/26; A45C 2013/226; A45C 2013/267; A45C 2013/306; A45C 13/262; A47B 95/02; A47B 88/00; G06F 1/1656; Y10T 16/455; Y10T 16/4554; A45F 2005/1066; A45F 5/102; H05K 5/023
USPC .......................................................... 16/405
See application file for complete search history.

(56) References Cited

U.S. PATENT DOCUMENTS

| | | | | |
|---|---|---|---|---|
| 1,495,752 A | * | 5/1924 | La Rue ................. | A45C 13/22 16/405 |
| 2,168,077 A | * | 8/1939 | Wheary ................. | A45C 13/26 16/405 |
| 2,723,417 A | * | 11/1955 | Furholmen ............ | A45C 13/26 16/405 |
| 3,113,651 A | * | 12/1963 | Szabo ................... | A45C 13/22 16/405 |
| 3,168,173 A | * | 2/1965 | Koffler ................. | A45C 13/26 16/405 |
| 3,297,120 A | * | 1/1967 | Bush ..................... | H04B 1/086 190/115 |

(Continued)

*Primary Examiner* — Emily M Morgan (57) ABSTRACT

A pull-out carrying handle is assembled to a case. The pull-out carrying handle includes a carrying handle and two links. Each of two ends of the carrying handle includes a first protrusion. Each of the links includes a first end and a second end, wherein the first end is assembled to the case, and the second end includes a sliding slot. The sliding slot of each link accommodates one first protrusion. With the single carrying handle, the first protrusions are respectively provided at two ends of the carrying handle, and the ends of the links having the sliding slots respectively accommodate the first protrusions. Thus, through the relative movements of the first protrusions and the sliding slots, the carrying handle can achieve an extensible effect.

13 Claims, 4 Drawing Sheets

(56) References Cited

U.S. PATENT DOCUMENTS

| | | | | | |
|---|---|---|---|---|---|
| 3,372,780 | A | * | 3/1968 | Fujioka | A45C 13/26 16/405 |
| 3,438,467 | A | * | 4/1969 | Milette | A45C 13/26 16/405 |
| 3,447,196 | A | * | 6/1969 | Szabo | A45C 13/26 16/405 |
| 3,795,941 | A | * | 3/1974 | Szabo | A45C 13/26 16/405 |
| 4,002,386 | A | * | 1/1977 | McKenzie | A47B 95/02 312/332.1 |
| 6,032,334 | A | * | 3/2000 | Iima | A45C 13/22 16/405 |
| 7,712,590 | B1 | * | 5/2010 | Lee | A45C 13/26 190/115 |
| 2021/0059061 | A1 | * | 2/2021 | Hsu | G06F 1/183 |
| 2021/0089088 | A1 | * | 3/2021 | Lee | H05K 5/069 |

* cited by examiner

PULL-OUT CARRYING HANDLE

CROSS-REFERENCE TO RELATED APPLICATIONS

The present application claims the benefit of U.S. provisional Patent Application No. 62/672,514, filed on May 16, 2018, the disclosure of which is hereby incorporated by reference herein in its entirety.

BACKGROUND OF THE INVENTION

Field of the Invention

The present invention relates to pull-out carrying handles and, more particularly, to a pull-out carrying handle having a simple structure and a simplified number of components.

Description of the Prior Art

To better move or carry a portable electronic device, a carrying handle for holding and grasping is provided on one lateral side of a case. The carrying handle provided can be a completely fixed type, that is, a carrying handle for holding and grasping is directly formed as an integral on the case or is provided in a fixed manner. A pull-out carrying handle is further available. After having been assembled, such pull-out carrying handle can be extended to a certain range. Accordingly, when the pull-out carrying handle is held by hands of different sizes, the pull-out carrying handle can be easily used without any holding difficulties.

SUMMARY OF THE INVENTION

To provide a carrying handle with an extensible effect, the carrying handle often needs to be separated into numerous components and then assembled to a case of an electronic device, so as to achieve the extensible effect. However, due to the above, the number of components that need to be manufactured as well as the assembly processes are increased, which correspondingly increase costs for manufacturing the components and time spent on the assembly processes. In view of the above, a pull-out carrying handle assembled to a case is provided according to an embodiment of the present invention. The pull-out carrying handle includes a carrying handle and two links. Each of two ends of the carrying handle includes a first protrusion. Each link includes a first end and a second end, wherein the first end is assembled to the case and the second end includes a sliding slot. The sliding slots of each link respectively accommodate one first protrusion.

With the single carrying handle, the first protrusions are respectively provided at two ends of the carrying handle, and the ends of the links having the sliding slots respectively accommodate the first protrusions. Thus, through the relative movements of the first protrusions and the sliding slots, the carrying handle can achieve an extensible effect. Since the carrying handle can produce an extensible effect by only assembling the carrying handle and the links to the case, the number of components that need to be manufactured is decreased while a simpler assembly is achieved, thereby reducing the costs for manufacturing the components and time for assembly processes.

In some embodiments, each link further includes a connecting portion located between the first end and the second end, and a middle section of the connecting portion is slightly recessed compared to the two sides. Thus, when the carrying handle approaches the case and is in a stored state, the case and the carrying handle respectively clamp the links at the middle sections of the connecting portions. At this point, because the middle sections of the connecting portions are slightly recessed compared to the two sides, the clamping effect of the case and the carrying handle is less tense in a way that relative movements between the links and the case or the carrying handle can be easier. When the carrying handle and the case respectively clamp the two sides of the connecting portions, the carrying handle and the case are more projected compared to the middle sections, such that a close-fit effect is produced between the carrying handle, the case and the links, and relative movements therebetween are made more difficult.

In some embodiments, the carrying handle can include two first limiting portions, and each of the first limiting portions is near one first protrusion. When the carrying handle receives a force and pushes against the second ends of the links, the second ends are stopped at the first limiting portions. Thus, when the links receive a force and move to a stored state to push against the carrying handle, the second ends of the links, under the restraints of the first limiting portions, can be stopped at the first limiting portions and do not continue to move further towards an inner side of the carrying handle. Furthermore, under the limiting effect of the first limiting portions, a user can learn that an extremum position is reached and does not continue applying a force upon the carrying handle.

In some embodiments, the first end of each link includes a guiding slot, and the case includes two second protrusions. Each guiding slot accommodates one second protrusion. In addition to the sliding slots provided at the first ends of the links connecting the carrying handle in a way that the links and the carrying handle can move relatively at the connecting parts, the guiding slots and the second protrusions can be further provided at the first ends of the links connecting the case. With the relative movements of the guiding slots and the second protrusions, the carrying handle can be further pulled and extended outwards, hence increasing the extension range.

In some embodiments, the case includes two second limiting portions, and each of the second limiting portions is near one second protrusion. When the first ends of the links receive a force and are pushed to the case, the first ends are stopped at the second limiting portions. Thus, when the links receive a force and are moved to a stored state to further push against the case, the first ends of the links, under the restraints of the second limiting portions, can be stopped at the second limiting portions and do not further move towards an inner side of the case. Furthermore, under the limiting effect of the second limiting portions, the user can learn that an extremum position is reached and does not continue applying a force upon the carrying handle.

In some embodiments, when the first ends of the links include the sliding slots, the second ends of the links include the guiding slots, and the sliding slots and the guiding slots respectively accommodate the first protrusions and the second protrusions, while the links are accommodated in the carrying handle and the case, each of the first protrusions is located at one end of the sliding slot of each link near the corresponding guiding slot, and each of the second protrusions is located at one end of the guiding slot of each link near the corresponding sliding slot. Thus, when the carrying handle is in a stored state, the links can be completely stored inside the carrying handle and the case in a way that the links cannot be directly seen from the exterior. Furthermore, by designing a state in which the first protrusions and the second protrusions are respectively stopped at one end of the sliding slots and the guiding slots as a stored state, the user is enabled to learn whether the stored state is achieved through a hand feel of holding, thus preventing an excessive operation on the carrying handle.

In some embodiments, the carrying handle can further include a holding portion and two clamping members, wherein the two clamping members are assembled to two ends of the holding portion, and the two first protrusions are further correspondingly provided at the two ends of the holding portion. Accordingly, by designing the holding portion of the carrying handle as an integral and complete holding structure instead of a structure separated into two individual upper and lower or left and right components and correspondingly joined, the structural strength at the holding portion of the carrying handle can be enhanced, and damage is not easily caused due to a force received from falling. By respectively providing the clamping members at the two sides of the holding portion, the assembly of the links can be facilitated. Furthermore, since the two sides are closer to the case than the middle part of the carrying handle, the two sides less likely become force receiving points contacting the ground when the electronic device falls, and the clamping members are also less likely to become disengaged due to the impact.

In some embodiments, the holding portion is an integral and non-detachable structure. For example, the holding portion can be a complete and seamless component, e.g., a single component formed by means such as injection molding. Alternatively, the holding portion may adopt a double-material injection molding process to cover an outer surface by a flexible plastic material. For example, a harder plastic material is first injected to form a body, and a covering flexible plastic material is formed similarly on the outer surface by means of injection molding, thus forming a holding portion that has two different materials and is still an integral component. By covering a flexible plastic material on the outer surface, a more comfortable hand feel can be provided when holding by a hand. Further, when receiving a force from an impact, the flexible plastic material can also provide a shock-absorbing effect.

Detailed features and advantages of the present invention are given in detail in the embodiments below. The disclosure is sufficient for a person skilled in the art to understand and accordingly implement the technical content of the present invention. Moreover, on the basis of the disclosures, claims and drawings of the present application, a person skilled in the art would easily understand the related objects and advantages of the present invention.

DETAILED DESCRIPTION OF THE EMBODIMENTS

Figure 1:
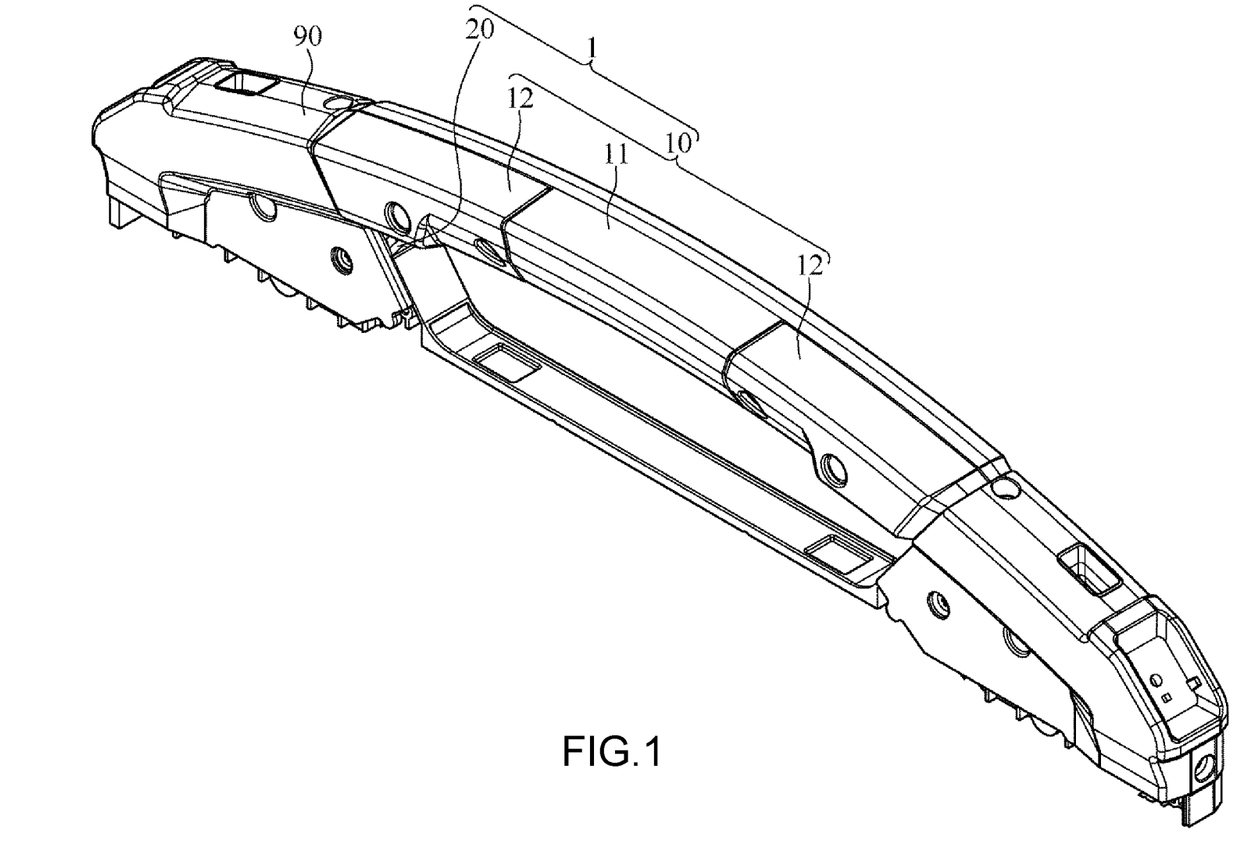
FIG. 1. is a schematic diagram of a pull-out carrying handle and a case according to a first embodiment of the present invention.
Figure 2:
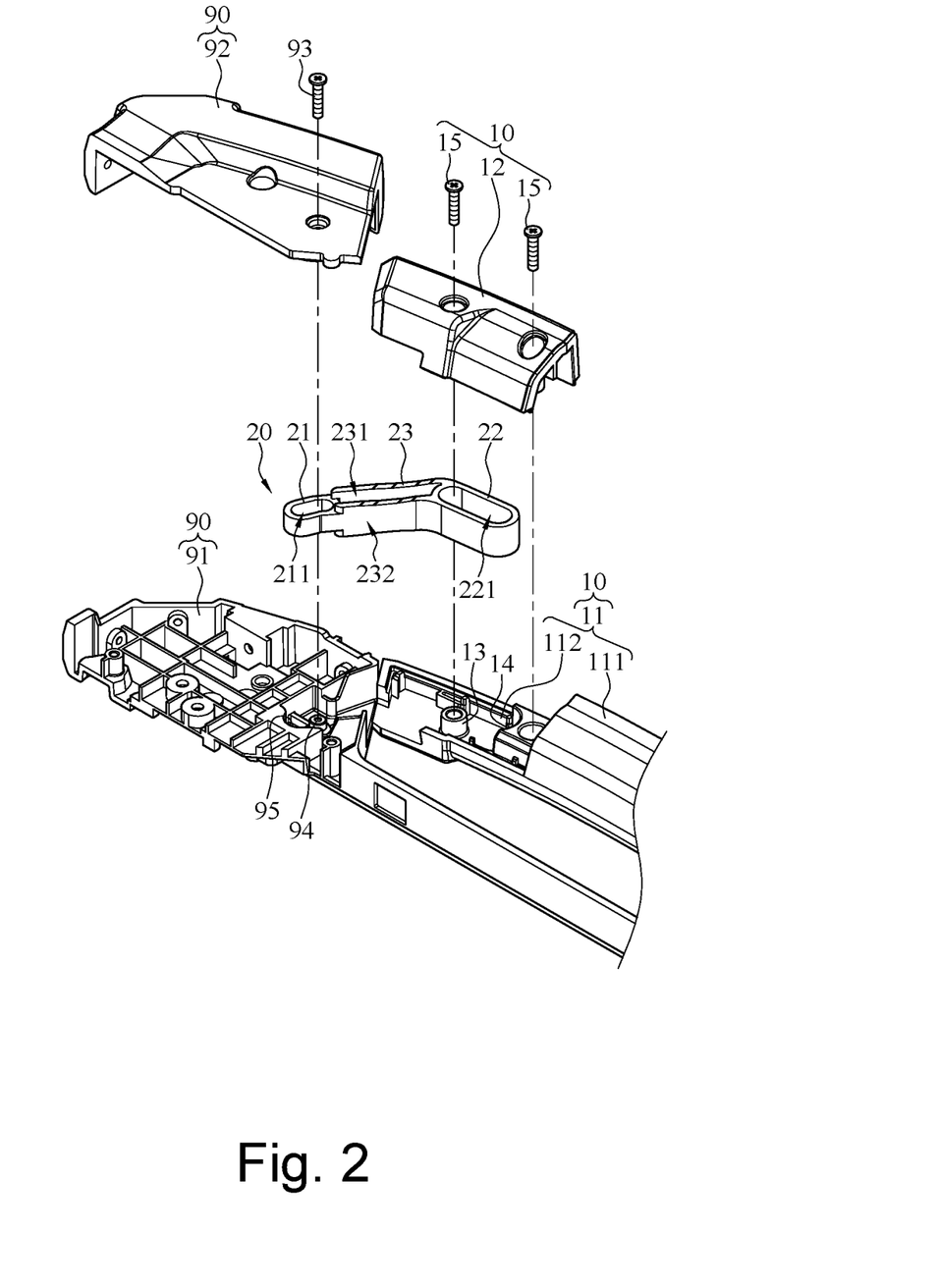
FIG. 2 is an enlarged partial exploded diagram of a pull-out carrying handle according to the first embodiment of the present invention.
Figure 3:
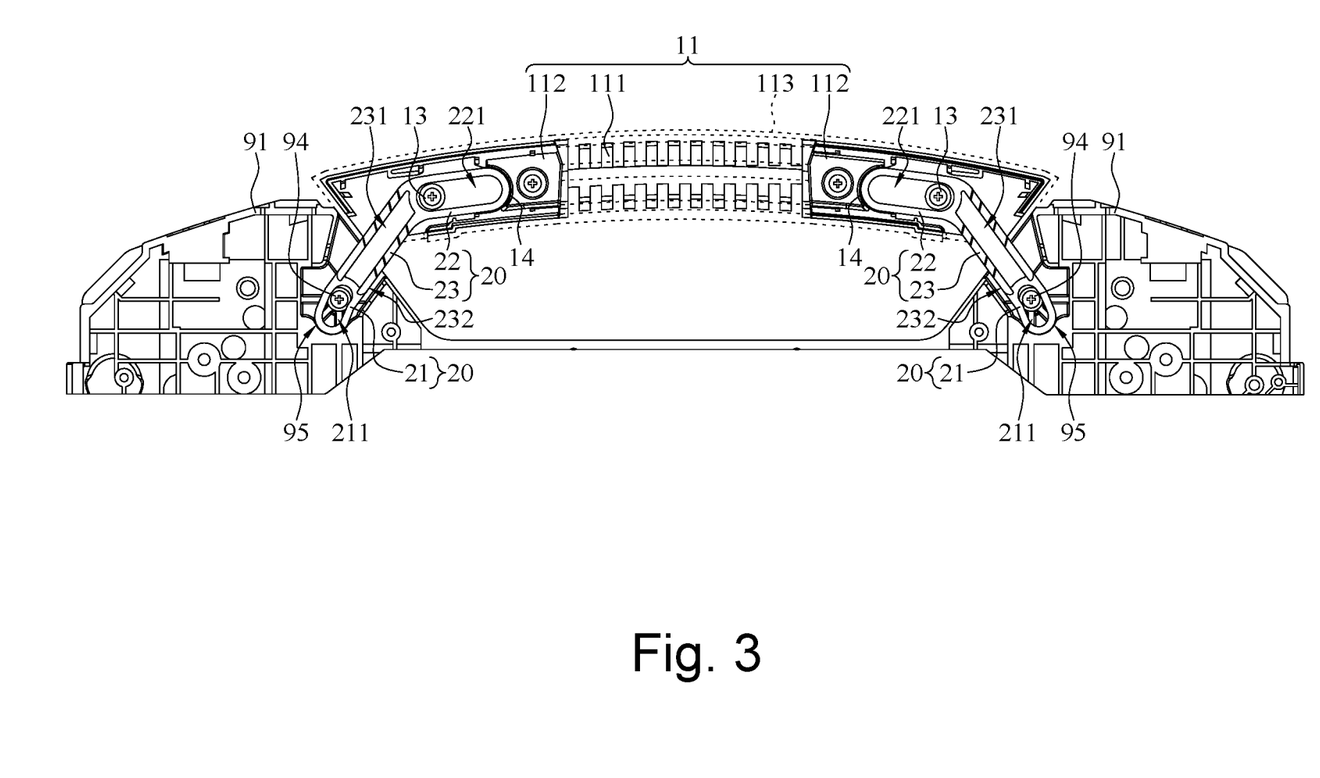
FIG. 3 is a partial perspective schematic diagram of a pull-out carrying handle in a stored state according to the first embodiment of the present invention.

Refer to FIG. 1 to FIG. 3. FIG. 1 shows a schematic diagram of a pull-out carrying handle and a case according to a first embodiment of the present invention. FIG. 2 shows an enlarged partial exploded diagram of a pull-out carrying handle according to the first embodiment of the present invention. FIG. 3 shows a partial perspective schematic diagram of a pull-out carrying handle in a stored state according to the first embodiment of the present invention. To better and clearly illustrate internal structures, some components are omitted in FIG. 3 and some components are perspectively depicted. Referring to FIG. 1, a pull-out carrying handle 1 of this embodiment is assembled on a case 90 of an electronic device, so as to provide a user with holding convenience to readily carry and move the electronic device.

As shown in FIG. 1 to FIG. 3, the pull-out carrying handle 1 includes a carrying handle 10 and two links 20. The carrying handle 10 includes a holding portion 11, two clamping members 12 and two first protrusions 13. The two clamping members 12 and the two first protrusions 13 are respectively provided at two ends of the holding portion 11. In the description below, the structure of one single end of the carrying handle 10 is described in detail as the two (left and right) ends thereof are in a symmetrical configuration, but it is known that the other end has the corresponding structure. In this embodiment, the holding portion 11 is an integral and non-detachable structure. A handheld portion 111 located in the middle is a complete arc-shaped rectangular strip for easy holding of the hand, and assembly portions 112 are respectively extended to the left and the right from the handheld portion 111. As seen from FIG. 1 and FIG. 2, the thickness of the assembly portion 112 is less than the thickness of the handheld portion 111, and the first protrusion 13 is provided in a projecting manner at the assembly portion 112. After the link 20 is assembled at the assembly portion 112, the clamping portion 12 is assembled to the assembly portion 112 through two fastening screws 15.

In this embodiment, the handheld portion 111 and the assembly portion 112 are an integral and non-detachable structure, and are a single component formed by means of, for example, injection molding. Thus, by designing the holding portion 11 of the carrying handle 10 as an integral and complete handheld structure instead of a structure separated into two individual upper and lower or left and right components and correspondingly joined, the structural strength of the holding portion 11 of the carrying handle 10 can be enhanced, in a way that damage is less likely caused when receiving a force from falling. Particularly, the handheld portion 111 in the middle is susceptible to receiving a force from falling as appearing more projected than the assembly portions 112 at the two sides. Therefore, the integrally formed and seamless structure having a certain thickness can effectively enhance the structural strength of the handheld portion 111.

As seen from the partial perspective diagram of FIG. 3, the holding portion 11 in this embodiment is made by adopting a double-material injection molding process, and can be made by means of single-material injection in other embodiments. In this embodiment, a harder plastic material is used for injection to form the handheld portion 111 and the assembly portion 112, and a flexible plastic material 113 (parts indicated by dotted lines) is covered on an outer surface. The flexible plastic material 113 can cover only the handheld portion 111 or cover the handheld portion 111 and the assembly portion 112. Although the holding portion 11 is made from two different materials, the holding portion 11 is nonetheless a structurally complete component since double-material injection molding is adopted. With the flexible plastic material 113 covering on the outside, a more comfortable hand feel can be provided during holding by the hand. When receiving a force from an impact, the flexible plastic material can also provide a shock-absorbing effect. Furthermore, because a fish-bone structure is used inside the handheld portion 111, certain bendability and flexibility are further provided to bring a shock-absorbing effect.

Again referring to FIG. 1 to FIG. 3, each link 20 includes a first end 21, a second end 22 and a connecting portion 23. The first end 21 and the second end 22 are respectively connected to two ends of the connecting portion 23. It is observed from FIG. 2 that the middle section 231 of the connecting portion 23 is slightly recessed compared to the two sides 232. Thus, when the carrying handle 10 is near the case 90 and is in a stored state (as the state shown in FIG. 3), the case 90 and the carrying handle 10 respectively clamp the link 20 at about the middle section 231 of the connecting portion 23. At this point, since the middle section 231 of the connecting portion 23 is slightly recessed compared to the two sides 232, the clamping effect of the case 90 and the carrying handle 10 is less tense, such that the relative movements between the link 20 and the case 90 or between the link 20 and the carrying handle 10 are made easier. When the carrying handle 10 and the case 90 respectively clamp the two sides of the connecting portion 23 (i.e., the state shown in FIG. 4), since the two sides of the connecting portion 23 appear more projected than the middle section 231, the two sides 232 of the connecting portion 23 is thicker than the middle section 231, such that an effect similar to close fitting is produced between the carrying handle 10 and the link 20 or between the case 90 and the link 20, and relative movements are made more difficult.

Accordingly, when the carrying handle 10 is to be moved from a stored state (the state in FIG. 3) to a held state (the state in FIG. 4), due to the recessed middle section, relative movements of the link 20 in regard to the carrying handle 10 and the case 90 are easier, and the user can more easily pull the carrying handle 10 out to the held state. Once the carrying handle 10 is moved and completely pulled out to the held state (FIG. 4), due to the effect similar to close fitting between the carrying handle 10 and the link 20 or between the case 90 and the link 20, relative movements between the carrying handle 10 and the link 20 as well as between the case 90 and the link 20 are made less easy. Thus, when the user holds the carrying handle 10 to carry and move the electronic device, the case 90, the link 20 and the carrying handle 10 are less susceptible to arbitrary relative movements, hence preventing issues of swaying or back-and-forth forces applied on the two ends of the link 20.

Figure 4:
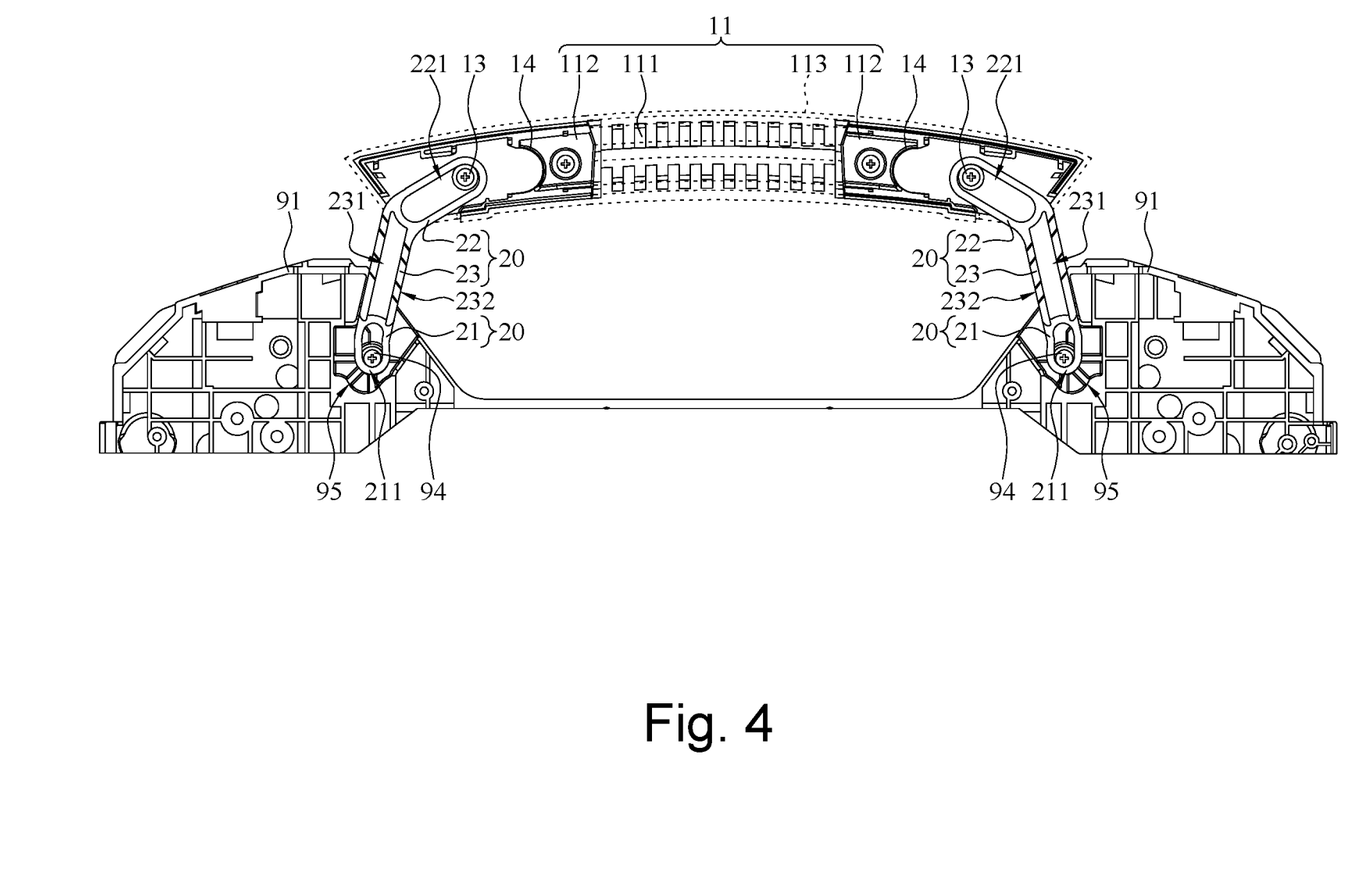
FIG. 4 is a partial perspective schematic diagram of a pull-out carrying handle in a held state according to the first embodiment of the present invention.

More specifically, when the carrying handle 10 is in a held state shown in FIG. 4, while the user holds the carrying handle 10 and moves the electronic device, the case 90 receives a downward gravitational force and a downward force is continuously applied on the link 20. While the user walks, up and down forces can be applied on the entire electronic device due to walking. At this point, if the case 90 and the link 20 are allowed with free relative movements, the case 90 will produce an additional downward force upon the link 20. Furthermore, the carrying handle 10 on the other end of the link 20 produces an upward force to further apply an outward force on two ends of the link 20. As such, over an extended period of use, the speed of damaging the link 20 can be accelerated. In addition, during the holding and moving process, in the presence of additional forces produced from the back-and-forth up and down swaying movements, the hand of the user may also feel an additional downward force and experience holding difficulties.

Referring to FIG. 2 as well as FIG. 3, the first end 21 of the link 20 has a guiding slot 211 and the second end 22 of the link 20 has a sliding slot 221. The sliding slot 221 at the second end 22 of the link 20 accommodates the first protrusion 13 of the carrying handle 10, such that the first protrusion 13 can move in the sliding slot 221 under the limiting and guiding effect of the sliding slot 221.

As seen from FIG. 1 and FIG. 2, the case 90 includes a bottom case 91, two upper covers 92, two fastening screws 93 and two second protrusions 94. The two second protrusions 94 are respectively provided at the two sides of the bottom case 91, and the two upper covers 92 are respectively fastened to the bottom case 91 through one fastening screw 93. After the guiding slot 211 at the first end 21 of the link 20 accommodates the second protrusion 94, the upper cover 92 is correspondingly assembled to the bottom case 91 and is then fastened by the fastening screw 93, such that the upper cover 92 and the bottom case 91 clamp the first end 21 of the link 20. Furthermore, the second protrusion 94 is allowed to move in the guiding slot 211 under the limiting and guiding effect of the guiding slot 211.

Accordingly, with the relative movements between the sliding slot 221 and the first protrusion 13, the carrying handle 10 can be pulled and extended outwards. Furthermore, with the relative movements of the guiding slot 211 and the second protrusion 94, the carrying handle 10 can be further pulled and extended outwards, hence increasing the extension range. In some embodiments, the configurations of the guiding slot 211 and the second protrusion 94 can be omitted, and the first end 21 of the link 20 is directly pivotally provided or fixedly provided at the case 90; that is, only the relative movement structures of the sliding slot 221 and the first protrusion 13 are preserved. In such implementation, the function of the pull-out carrying handle 1 can still be maintained while providing a more simplified overall structure.

Refer to FIG. 2 to FIG. 4. FIG. 4 shows a schematic diagram of the pull-out carrying handle in a held state according to the first embodiment of the present invention. To better and clearly illustrate internal structures, some components are omitted in FIG. 4 and some components therein are perspectively depicted. As seen from FIG. 3 and FIG. 4, a second limiting portion 95 is provided at the bottom case 91 of the case 90 near each second protrusion 94. When the link 20 receives a force and moves to the stored state shown in FIG. 3 and pushes against the case 90, the first end 21 of the link 20 is stopped at the second limiting portion 95. Accordingly, when the link 20 receives a force and moves to the stored state to push against the case 90, the first end 21 of the link 20, under the restraint of the second limiting portion 95, is stopped at the second limiting portion 95 and does not continue to move towards an inner side of the case 90. Furthermore, under the limiting effect of the second limiting portion 95, the user can learn through a hand feel that an extremum position is reached and does not continue applying a force upon the carrying handle 10. Moreover, to enable the second limiting portion 95 to provide a better limiting effect, the shape of the second limiting portion 95 can correspond to that of the first end 21, such that the first end 21 can be more easily accommodated and be stopped at the second limiting portion 95.

Similarly, as seen from FIG. 3 and FIG. 4, a first limiting portion 14 is provided on the assembly portion 112 at each of two ends of the carrying handle 10 near each first protrusion 13. When the link 20 receives a force and moves to the stored state in FIG. 3 to push against the carrying handle 10, the second end 22 of the link 20 is stopped at the first limiting portion 14. Accordingly, when the link 20 receives a force and moves to the stored state to push against the carrying handle 10, the second end 22 of the link 20, under the restraint of the first limiting portion 14, is stopped at the first limiting portion 14 and does not continue to move towards an inner side of the carrying handle 10. Furthermore, under the limiting effect of the first limiting portion 14, the user can learn through a hand feel that an extremum position is reached and does not continue applying a force upon the carrying handle 10. Moreover, to enable the first limiting portion 14 to provide a better limiting effect, the shape of the first limiting portion 14 can correspond to that of the second end 22, such that the second end 22 can be more easily accommodated and be stopped at the first limiting portion 14.

As seen from FIG. 3, when the pull-out carrying handle 1 is in a stored state, the links 20 are accommodated in the carrying handle 10 and the case 90, as shown in FIG. 1. When the links 20 are accommodated in the carrying handle 10 and the case 90, each of the first protrusions 13 is located at one end of the sliding slot 221 of each link 20 near the corresponding guiding slot 211, and each of the second protrusions 94 is located at one end of the guiding slot 211 of each link 20 near the corresponding sliding slot 221. When the carrying handle 10 is in a stored state, the links 20 can be completely accommodated in the carrying handle 10 and the case 90, and the guiding slots 211 or sliding slots 221 at the two ends of the links 20 cannot be directly seen from the exterior. Further, by designing a state in which the first protrusion 13 and the second protrusion 94 are respectively stopped at one end of the sliding slot 221 and the guiding slot 211 as the stored state, the user can learn whether the storage process is complete through a hand feel when holding the carrying handle 10, thus preventing excessive operation on the carrying handle 10.

Through the above structure, in the pull-out carrying handle 1 according to an embodiment of the present invention, one single carrying handle 10 is provided, the first protrusion 13 is provided at each of two ends of the carrying handle 10, and one end of each link 20 having the sliding slot 221 accommodates the first protrusion 13, thereby providing the carrying handle 10 with an extensible effect through the relative movements of the first protrusion 13 and the sliding slot 221. Meanwhile, by providing the second protrusion 94 on the case 90 and accommodating the second protrusion 94 at one end of the link 20 having the guiding slot 211, the carrying handle 10 is provided with an effect of achieving a greater extensible range through the relative movements of the second protrusion 94 and the guiding slot 211. Since the carrying handle 10 can produce an extensible effect by only assembling the carrying handle 10 and the links 20 to the case 90, the number of components that need to be manufactured is decreased while a simpler assembly is achieved, thereby reducing the costs for manufacturing the components and time for assembly processes.

While the invention has been disclosed by way of the foregoing embodiments, it is to be understood the embodiments are not for limiting the invention thereto. Slight modifications and alterations can be made by a person skilled in the art without departing from the spirit and scope of the present invention. Therefore, the protection scope of the present invention should be defined by the appended claims of the present application.

What is claimed is:

1. A pull-out carrying handle, assembled to a case, comprising:

a carrying handle, comprising a holding portion, two clamping members, and two first protrusions, wherein the clamping members are respectively fixed to the holding portion at each of two ends thereof to form a cavity at each of the two ends, and the first protrusions are respectively located inside the cavities, and wherein the carrying handle is moveable between a held position and a stored position; and two links, each of the links comprising a first end and a second end, the first end assembled to the case, the second end received inside one of the cavities and comprising a sliding slot, the sliding slot of each link accommodating one first protrusion;

wherein the carrying handle further comprises two first limiting portions, each of the first limiting portions is inside a respective one of the cavities near one first protrusion, arranged such that when the carrying handle is in the held position and receives a force to move it to the stored position, the second ends of the links are driven directly in towards the respective first limiting portions and driven into and stopped at the respective first limiting portions.

2. The pull-out carrying handle according to claim 1, wherein each link further comprises a connecting portion located between the first end and the second end, and a middle section of the connecting portion comprises a side having a slightly recessed portion extending longitudinally from the first end to the second end.

3. The pull-out carrying handle according to claim 1, wherein the two clamping members are assembled at two ends of the holding portion to form a cavity at each end of the carrying handle, and the two first protrusions are also correspondingly provided at the two ends of the holding portion inside a respective one of the cavities, and the second ends of the links are each received inside a respective one of the cavities.

4. The pull-out carrying handle according to claim 3, wherein the holding portion comprises:

a handheld portion; and two assembly portions located at respective ends of the handheld portion, with which the clamping members are respectively assembled;

wherein the two first protrusions are respectively provided on and part of the two assembly portions; and wherein the handheld portion and two assembly portions, including the respective two first protrusions, together form an integral and non-detachable structure.

5. The pull-out carrying handle according to claim 3, wherein the holding portion is formed by a double-material injection molding process and comprises an inner portion comprising hard rigid material and an outer portion comprising a flexible plastic material.

6. The pull-out carrying handle according to claim 4, wherein an extension direction of each of the two assembly portions is different than an extension direction of its corresponding first protrusion.

7. The pull-out carrying handle according to claim 1, wherein the shape of the first limiting portions and the shape of an outer portion of the second ends of the two links are complementary.

8. A device comprising:
a pull-out carrying handle comprising:
- a carrying handle, comprising a first protrusion at each of two ends thereof, wherein the carrying handle is moveable between a held position and a stored position; and
- two links, each of the links comprising a first end and a second end, the first end of each link assembled to a case, the second end of each link comprising a sliding slot, the sliding slot of each link accommodating one first protrusion, wherein the carrying handle further comprises two first limiting portions, each of the first limiting portions is near one first protrusion, arranged such that when the carrying handle is in the held position and receives a force to move it to the stored position, the second ends of the links are driven directly towards the respective first limiting portions and driven into and stopped at the respective first limiting portions, and wherein the first end of each of the links comprises a guiding slot, where the guiding slots and sliding slots are discrete, and a longitudinal extension direction of the each guiding slot and a longitudinal extension direction of each sliding slot are different; and
- the case comprising two second protrusions;
- wherein each guiding slot is an elongated opening having a first end and a second end and accommodates and limits the movement one second protrusion, arranged such that each second protrusion is slidable in the respective guiding slot from a first position in which said second protrusion contacts the first end and is separated for the second end of the respective guiding slot, and a second position in which said second protrusion contacts the second end and is separated from the first end of the respective guiding slot.

9. The device according to claim 8, wherein the case comprises two second limiting portions, each of the second limiting portions is near one of the second protrusions, and the first ends of the links are stopped at the respective second limiting portions when the first ends of the links receive a force and push against the case.

10. The device according to claim 8, arranged such that when the carrying handle is in the stored position, each of the first protrusions is located at one end of the sliding slot of each link nearest the corresponding guiding slot, and each of the second protrusions is located at one end of the guiding slot of each link nearest the corresponding sliding slot.

11. A pull-out carrying handle, assembled to a case, comprising:
- a carrying handle comprising a holding portion and two clamping members, the holding portion comprising:
  - a handheld portion; and
  - two assembly portions located at respective ends of the handheld portion, wherein each of the two assembly portions comprises a first protrusion;
  - wherein the clamping members are respectively fixed to the assembly portions at the respective ends of the handheld portion to form a cavity at each of the two ends, and the first protrusions are respectively located inside the cavities; and
- two links, each of the links comprising a first end and a second end, the first end assembled to the case, the second end received inside one of the cavities and comprising a sliding slot, the sliding slot of each link accommodating one first protrusion;
- wherein the handheld portion and the two assembly portions, including the respective first protrusions, together form an integral and seamless structure.

12. The pull-out carrying handle according to claim 11, wherein the holding portion is formed by a double-material injection molding process and comprises an inner portion comprising hard rigid material and an outer portion comprising a flexible plastic material.

13. The pull-out carrying handle according to claim 11, wherein an extension direction of each of the two assembly portions is different than an extension direction of its corresponding first protrusion.

* * * * *